Nov. 10, 1970 G. R. CASHAU ETAL 3,539,408

METHODS OF ETCHING CHROMIUM PATTERNS AND PHOTOLITHOGRAPHIC MASKS SO PRODUCED

Filed Aug. 11, 1967

INVENTORS
G.R. CASHAU
J.W. GEORGE
BY [signature]
ATTORNEY

United States Patent Office 3,539,408
Patented Nov. 10, 1970

3,539,408

METHODS OF ETCHING CHROMIUM PATTERNS AND PHOTOLITHOGRAPHIC MASKS SO PRODUCED

George R. Cashau, Phillipsburg, N.J., and James W. George, Allentown, Pa., assignors to Western Electric Company, Incorporated, New York, N.Y., a corporation of New York Filed Aug. 11, 1967, Ser. No. 659,895
Int. Cl. C23f *1/02*
U.S. Cl. 156—4 12 Claims

ABSTRACT OF THE DISCLOSURE

Masks for use in photolithographic and etching processes are prepared by the vapor deposition of chromium onto a substrate, such as a glass plate, and the subsequent masking and etching of the desired patterns into the chromium. A mixture of phosphoric and sulfuric acids is used as the etching solution and its action is initiated by contacting the chromium surface with a metallic wire. The masks so prepared have sharp lines delineating the transparent and opaque portions of the mask and are particularly well suited for use in the manufacture of semiconductor devices and integrated circuits where fine resolution is required.

BACKGROUND OF THE INVENTION

Field of the invention

Figures 1, 2:
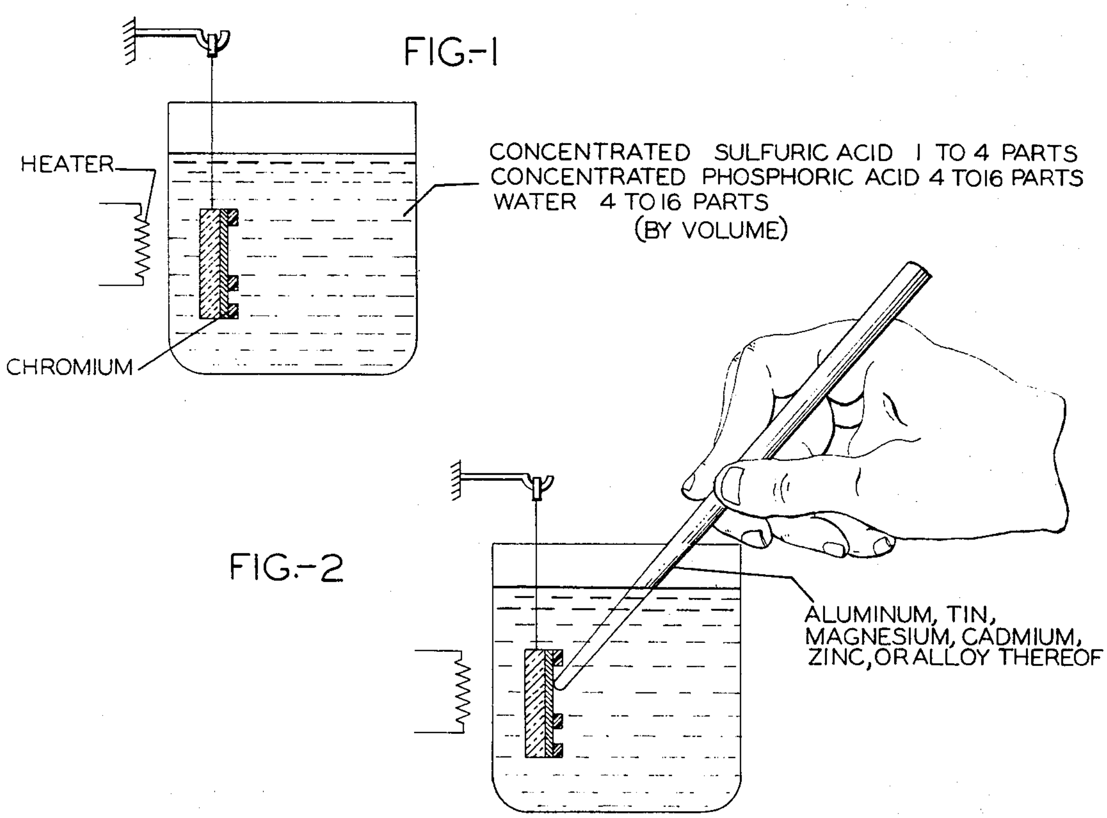

This invention relates generally to improved masks for use in photolithographic and etching processes and to improved methods for their preparation. The masks with which this invention is concerned provide especially fine definition and optical resolution as is required in the manufacture of relatively small, high precision articles. Because the manufacture of semiconductor devices and integrated circuits is particularly demonstrative of the utility of this invention, the masks will be described with particular emphasis on the manufacture of these devices. It is understood, however, that the invention is not to be so limited, but may be used in other photolithographic and etching processes.

Description of the prior art

In the manufacture of semiconductor devices and integrated circuits, it is frequently desirable to utilize photolithographic and etching processes in order to obtain various patterns of materials deposited on or diffused into a substrate. For example, in the preparation of semiconductor devices, the diffusion of a conductivity type determining impurity into a base material may be controlled by means of an oxide mask. In these processes, the base material is provided with an oxide surface layer, a selected portion of which is removed so that the surface may by treated by exposure to various gases having conductivity type determining impurities. Diffusion into the base material will be inhibited by the oxide layer, depending on its thickness and the type of impurity used. Thus, the impurity diffusion takes place only in the unmasked areas, and a base material is produced having a plurality of conductivity type regions differing from the original material. By the use of successive masking and diffusing steps, a diffused structure having complex arrangements of different conductivity type regions is formed.

Typically, the oxide mask patterns are formed by the conventional photolithographic and etching processes. These processes are particularly desirable since they enable complicated patterns to be etched accurately onto the surface of the base material. In these processes, the oxidized surface of the base material, or wafer, is coated with a photosensitive material to form a resist, and the latter is then exposed to ultraviolet light through an apertured mask or stencil. The light-exposed portions of the resist polymerize. Because these polymerized portions are insoluble in developing fluid, they remain as a film on the oxide layer while the protected portions of the resist are dissolved by the fluid leaving a plurality of apertures or windows opened in the resist. As these apertures expose small areas in the oxide layer, a corrosive fluid, such as a dilute aqueous solution of hydrofluoric acid containing ammonium fluoride (e.g., 6.8% HF and 31.6% $NH_4F$ by weight), which will attack the oxide layer but not the wafer itself, may be applied to the photoresist and to the exposed areas of the oxide layer to etch a pattern of tiny apertures in the oxide layer. In subsequent manufacturing operations, as noted above, impurity materials may be diffused through these aperatures in the oxide mask and into the semiconductor wafer to create a pattern of p-n junctions or metallic contacts may be evaporated on the exposed portions of the semiconductor wafer to form terminals thereon.

The use of these photolithographic and etching processes is also of great utility in the manufacture of integrated circuits. Exemplary of one operation in which these are particularly useful is the development of resistor patterns. Here a layer of low conductivity materials may be evaporated over a substrate and then, in a manner similar to that described above, the substrate is coated with a photoresist material, perferably a "positive" photoresist, and the photoresist material is exposed to a source of light through a mask constituting a negative image of the desired resistor pattern. When a positive photoresist is used, the exposed resist is washed away by means of a solvent, and then the resistor pattern is formed by etching away the exposed surface of the low conductive material.

It will be understood that the degree of accuracy that can be obtained in photolithographic and etching processes necessarily is limited to the degree of resolution that can be obtained in masking and exposing the photoresist material. Due to the great emphasis being placed upon miniaturization, it is becoming increasingly important to obtain greater and greater resolution. For this reason, a mask that is used in exposing photoresist materials should, ideally, block out ultraviolet light completely in specified areas and have a sharp line delineating the transparent and opaque portions of the mask.

As is described in our copending application Ser. No. 659,896, filed of even date, high quality masks can be prepared by vaporizing a layer of chromium over a glass plate and then etching a desired pattern in the chromium layer by using conventional photolithographic and etching methods. As described in this referenced application, it is preferred to apply the chromium in two steps that are separated by an intermediate surface abrading step.

It can be understood that if sharp lines delineating the transparent areas from the opaque areas of the mask are to be obtained, the chromium layer must be etched with care so that the edges of the photoresist image will not be undercut. If these edges are undercut, an indistinct, irregular or jagged line will separate the transparent and opaque areas with an attendant loss in definition of the images photographically reproduced therefrom.

SUMMARY OF THE INVENTION

Accordingly, it is an object of this invention to provide an improved mask for use in photolithographic processes that has sharp, well defined lines delineating the transparent areas from the opaque areas.

A further object of this invention is to provide improved etching solutions with reduced tendencies to cause undercutting when etching patterns in chromium-coated glass masks.

Yet another object of this invention is to provide novel methods for initiating the rapid action of the etching solutions of this invention.

Briefly, these and other objects of this invention are achieved by etching a pattern into a chromium-coated glass mask by use of an acid solution ocmprised of a mixture of phosphoric and sulfuric acids. The rapid action of this etching solution is initiated by contacting a portion of the exposed chromium surface with a metallic wire preferably comprised of aluminum, tin, magnesium, zinc, cadmium, and the like.

Figures 3, 4:
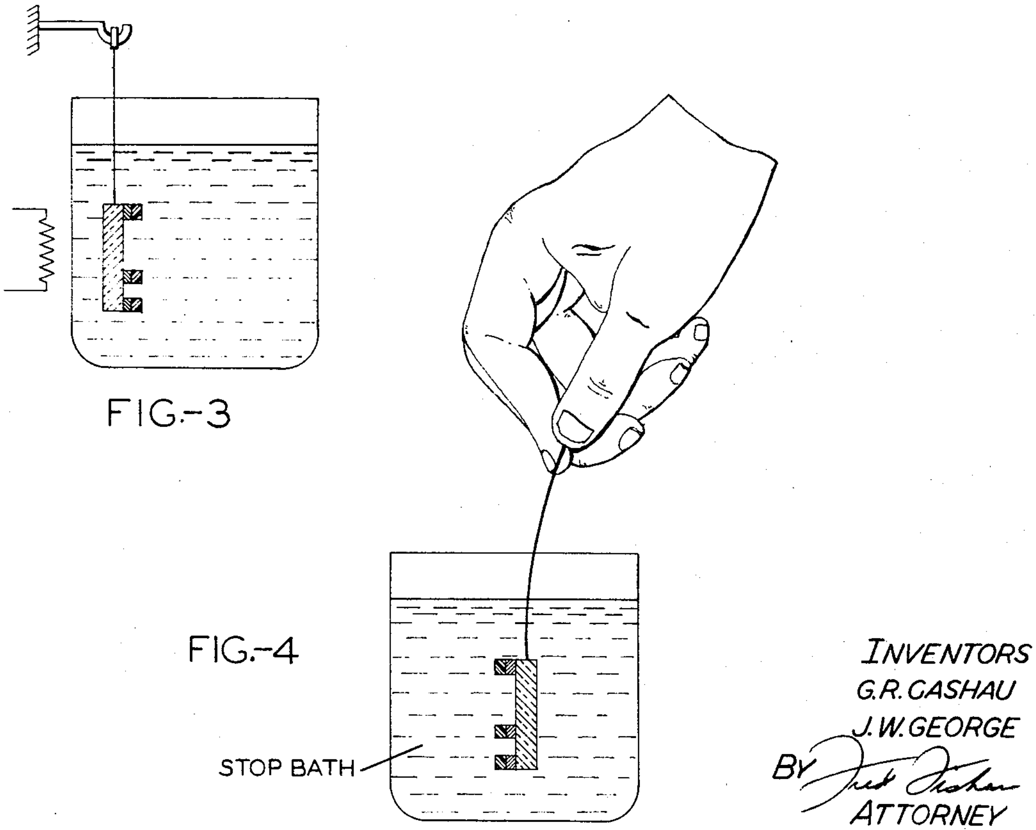

To facilitate an understanding of this invention, FIGS. 1, 2, 3, and 4, when viewed sequentially, constitute an illustration of a disclosed method thereof.

EXAMPLE

A thin coating of chromium was applied to a glass substrate by utilizing vapor deposition techniques. As described in our copending application of even date, it is advantageous to apply this coating in two separate steps that are separated by an abrading operation that removes any loosely adhering bits of chromium. In this manner, a substantially pinhole-free, thin coating of chromium, preferably between about 800 to 1,200 Angstrom units, can be obtained.

The chromium-plated substrate was then coated with a standard positive photoresist material, and a mask pattern was transferred from a master photographic emulsion to the photoresist by contact printing under ultraviolet light. The pattern was then developed by washing away with a solvent the exposed photoresist to bare the metal film.

An etching solution was then prepared by mixing together, by volume, one part concentrated sulfuric acid (ACS reagent grade, 95–98% $H_2SO_4$); 4 parts concentrated phosphoric acid (ACS reagent grade, at least 85% $H_3PO_4$); and 4 parts deionized water. The substrate was immersed in this solution, but no dissolution of the exposed chromium was observed. Upon a single touching of the chromium surface with a fine aluminum wire, however, a very rapid reaction was initiated at the point of contact. Once the reaction was initiated, it was rapidly propagated from the point of contact over the entire exposed chromium surface until this surface was completely dissolved. In this example, the etching was completed in a period of about 3–5 seconds. In this and other experiments, it was established that the aluminum wire had only to be brought into touching relationship with the surface of the chromium at a single point and that a scratching or abrading of the chromium surface by the wire was not required.

Preferably the acid solution is preheated, for example, to a temperature of about 140° F., and this temperature is maintained during the etching operation.

The reaction produced a great number of gas bubbles that adhered to the chromium surface. In order that they would not form a blanket to interfere with the intimate contact of the acid solution with the exposed surfaces of the chromium, it was necessary ot remove these bubbles during the etching process by wiping the surface with a soft applicator.

It is conventional, when the etching progresses to the desired degree, to stop the reaction abruptly by immersing the substrate in a stop bath of ammonium hydroxide. The use of such a stop bath prevents undercutting of the edges of the photoresist image by acid attacking laterally from the etched areas and is particularly critical when etching with solutions such as concentrated sulfuric or concentrated hydrochloric acid. Unless the substrate is immediately removed from the acid solution and immersed in the stop bath at almost the precise instant that the desired amount of chromium has been etched away, the acid will undercut the photoresist. Further, when undercutting does occur, the edges separating the transparent and opaque areas are generally in the form of indistinct, irregular or jagged lines. This will neecssarily result in a loss in definition of the images photographically reproduced therefrom.

Quite surprisingly, despite the fact that the etching reaction of this invention proceeds with great rapidity, no undercutting of the edges of the photoresist image are observed even if the substrate remains in the etching solution for a moderate period of time longer than that required to etch away the exposed surface. For example, the substrate may remain in the acid bath for up to 20 to 30 seconds beyond the 3 to 5 seconds required to complete the etching without any observable undercutting taking place. Thus, it can be seen that the etching solution of the instant invention is particularly desirable to use since it is effective to etch the chromium to the edge of the photoresist image, but then, for some inexplicable reason, does not immediately continue its action to undercut the photoresist. This provides for considerably more latitude in the etching operation.

If desired, the substrate may be allowed to remain in the etching solution of this invention for a period of time somewhat greater than 20 to 30 seconds. When this is done, it has been observed that the etching will eventually continue and cause undercutting of the photoresist image. However, when this undercutting takes place, it does not produce the irregular or jagged lines of the prior art etching methods, but rather yields a smooth, even, sharp line from which well-defined images can be photographically reproduced. Thus, the use of the etching methods of this invention may prove particularly advantageous if it is desired to increase the transparent areas of the mask pattern, as this can be accomplished by merely detaining the substrate in the etching solution for a longer period of time.

The substrate was removed from the etching solution after about 20 seconds and was then immersed in a stop solution comprised of ammonium hydroxide to neutralize the acid. The protective photoresist material was removed from the plate and the chromium mask thus revealed was cleaned in a dilute solution of sodium hydroxide by vigorous scrubbing with a soft vinyl sponge. After a final rinse with deionized water, the mask was blown completely dry using compressed air. Upon visual observation, it was found that an especially sharp line, substantially free from undercutting, delineated the transparent areas from the opaque areas of the mask.

In the practice of this invention, the concentration of the etching solution is not extremely critical and can vary within limits. As discussed in more detail above, however, if only sulfuric acid is used, the action of the acid is quite accelerated and may cause serious undercutting of the masked areas of the substrate. This effect will also be observed if concentrated hydrochloric acid is used.

On the other hand, phosphoric acid by itself has seemingly no effect upon the chromium and is ineffective to dissolve it. However, when sulfuric acid is diluted and mixed with phosphoric acid, the dissolution reaction will proceed rapidly, but quite surprisingly, stops abruptly at the masked areas of the substrate so that no undercutting will result Quite generally, satisfactory etching solutions can be comprised of the following, based upon parts by volume:

1–4 parts concentrated sulfuric acid;
4–16 parts concentrated phosphoric acid;
4–16 parts water.

As mentioned in the example, no apparent reaction takes place between the etching solution of this invention and the exposed chromium until a portion of the exposed chromium is touched with a metallic wire. After such contact is made, however, the reaction rapidly propogates itself from this point and continues to spread until all of the exposed chromium is dissolved in the solution. The reason why this contact with a metal initiates the reaction is not well understood, but it is believed that some kind of catalytic effect is involved. Therefore, for want of a better term, the metals that are effective to initiate the dissolution of chromium in the etching solution of this invention are referred to herein as "catalytic metals." Of the various catalytic metals utilized to initiate the dissolution reaction, those comprised of aluminum, tin, magnesium, zinc, cadmium, and alloys of these metals, have proven effective. Of these metals, aluminum is the most preferred since it performs its function particularly well.

Another benefit that accrues through the practice of this invention lies in the fact that the etching solution of sulfuric and phosphoric acids is effective to dissolve chromium when it is touched with a catalytic metal wire, even when the chromium is in the passive state. As is known, chromium undergoes a transition from an active to a passive state when exposed to air for a period of time. When in the active state, chromium may readily be dissolved by standard techniques. However, once it enters the passive state, standard solvents such as concentrated sulfuric or hydrochloric acids will not be effective to dissolve the chromium until such time as it has been reactivated. Since, in the practice of this invention, the dissolution will proceed with rapidity whether the chromium is in the active or passive state, the chromium-coated substrate may be held for long periods prior to performing the etching step. By way of example, it may be noted that if the prior art etching methods are used, it is necessary to etch the chromium-coated substrate within a few days after it has been coated. On the other hand, when the methods of this invention are used, substrates that were held for periods of up to six months were readily etched even though the chromium was in the passive state.

Although certain embodiments of the invention have been described in the specification, it is to be understood that the invention is not limited thereto, is capable of modification, and can be rearranged without departing from the spirit and scope of the invention.

What is claimed is:

1. In a method of making a photolithographic mask, including vapor depositing a chromium layer upon a glass substrate, and applying a polymerized photoresist pattern onto said chromium layer to protect portions thereof, an improved method for dissolving the unprotected portions of chromium from the glass substrate, comprising:

contacting the chromium with a solution comprised of sulfuric and phosphoric acids, and initiating the dissolution of the chromium by touching at least one point on the surface of the chromium with a catalytic metal.

2. The method of claim 1, wherein the solution is comprised, by volume, of from about 1 to 4 parts concentrated sulfuric acid; from about 4 to 16 parts concentrated phosphoric acid; and from about 4 to 16 parts water.

3. The method of claim 1, wherein the metal is aluminum, tin, magnesium, cadmium, zinc, or alloys containing any of these metals.

4. In a method of making a photolithographic mask, including vapor depositing a chromium layer upon a glass substrate, and applying a polymerized photoresist pattern onto said chromium layer to mask portions thereof, including a method for dissolving selected portions of the chromium layer from unmasked portions of the chromium-coated substrate by contacting the unmasked portions with an etching solution; the improvement comprising utilizing a mixture comprised of sulfuric and phosphoric acids as the etching solution and initiating the dissolution of the chromium by touching at least one point on the unmasked portions with a catalytic metal.

5. The method of claim 4, wherein the etching solution is comprised, by volume, of from about 1 to 4 parts concentrated sulfuric acid; from about 4 to 16 parts concentrated phosphoric acid; and from about 4 to 16 parts water.

6. The method of claim 4, wherein the metal is aluminum, tin, magnesium, cadmium, zinc, or alloys containing any of these metals.

7. The method of claim 6, wherein the metal is aluminum.

8. The method of claim 4, wherein the substrate is immersed in a stop bath after the dissolution of the chromium.

9. The method of claim 4, wherein the etching solution is heated.

10. The method of claim 9, wherein the etching solution is heated to about 140° F. and the etching solution is comprised, by volume, of about 1 part concentrated sulfuric acid; 4 parts concentrated phosphoric acid; and 4 parts water.

11. A photolithographic mask prepared in accordance with the method of claim 4, wherein the chromium-coated portions of the substrate are delineated from the portion of the substrate from which the chromium was dissolved by means of a sharp, smooth line.

12. The method of claim 1, wherein the chromium is in the passive state.

References Cited

UNITED STATES PATENTS

| | | | |
|---|---|---|---|
| 3,194,704 | 7/1965 | Hubert | 156—22 |
| 3,290,192 | 12/1966 | Kelley | 156—17 |
| 3,411,999 | 11/1968 | Weinberg | 204—141 |

JACOB H. STEINBERG, Primary Examiner

U.S. Cl. X.R.

156—3, 13; 204—143; 252—79.2